United States Patent
Okamura et al.

(10) Patent No.: US 6,769,966 B2
(45) Date of Patent: Aug. 3, 2004

(54) WORKPIECE HOLDER FOR POLISHING, POLISHING APPARATUS AND POLISHING METHOD

(75) Inventors: Kouichi Okamura, Niigata (JP); Noboru Tamai, Nagano (JP); Kouzi Morita, Fukushima (JP); Hisashi Masumura, Fukushima (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 253 days.

(21) Appl. No.: 09/979,641

(22) PCT Filed: May 27, 2001

(86) PCT No.: PCT/JP01/02452

§ 371 (c)(1),
(2), (4) Date: Nov. 26, 2001

(87) PCT Pub. No.: WO01/72471

PCT Pub. Date: Oct. 4, 2001

(65) Prior Publication Data

US 2002/0160697 A1 Oct. 31, 2002

(30) Foreign Application Priority Data

Mar. 29, 2000 (JP) ........................................ 2000-092344

(51) Int. Cl.[7] ............................................... B24B 7/22
(52) U.S. Cl. ......................... 451/53; 451/289; 451/388
(58) Field of Search .............................. 451/53, 7, 449, 451/488, 388, 289

(56) References Cited

U.S. PATENT DOCUMENTS

| | | | | |
|---|---|---|---|---|
| 3,571,978 A | * | 3/1971 | Day et al. | 451/285 |
| 4,270,316 A | * | 6/1981 | Kramer et al. | 451/41 |
| 5,036,630 A | * | 8/1991 | Kaanta et al. | 451/41 |
| 5,605,488 A | * | 2/1997 | Ohashi et al. | 451/7 |
| 5,762,544 A | | 6/1998 | Zuniga et al. | |
| 5,873,769 A | * | 2/1999 | Chiou et al. | 451/7 |
| 6,077,151 A | * | 6/2000 | Black et al. | 451/53 |

FOREIGN PATENT DOCUMENTS

| | | |
|---|---|---|
| JP | A 7-171759 | 7/1995 |
| JP | A 9-29591 | 2/1997 |
| JP | A 9-38856 | 2/1997 |
| JP | A 9-168968 | 6/1997 |

* cited by examiner

Primary Examiner—Robert A. Rose
(74) Attorney, Agent, or Firm—Oliff & Berridge, PLC

(57) ABSTRACT

The present invention is a workpiece holder for polishing comprising at least a workpiece holder body having multiple perforated holes for holding a workpiece by vacuum adsorption and a back plate disposed on the back side of the body, which is provided with temperature controlling means or cooling means for the holder body. Thus, there is provided a workpiece holder for polishing, a polishing apparatus and a polishing method, which can provide a workpiece having good flatness by suppressing thermal deformation of the workpiece holder body and deformation of a resin film coated on the workpiece holding surface without degrading flatness of a workpiece held on the workpiece holder in the polishing of the workpiece, even when the number of polishing operation increases.

20 Claims, 3 Drawing Sheets

(a) Relevant Art (b) Relevant Art (a)

(b) Relevant Art

WORKPIECE HOLDER FOR POLISHING, POLISHING APPARATUS AND POLISHING METHOD

TECHNICAL FIELD

The present invention relates to a workpiece holder for polishing, a polishing apparatus and a polishing method, which are used for precision polishing of a surface of workpiece such as a semiconductor wafer.

BACKGROUND ART

As a method for processing semiconductor wafers, in general, there are successively performed a slicing step to slice a thin disc (wafer) from a single crystal ingot, a chamfering step to prevent cracking of a peripheral edge portion of the wafer, a lapping step to eliminate unevenness of the wafer thickness, an etching step to remove a mechanical damage or contaminants, a polishing step to make the chamfered portion and the main surface of the wafer into mirror surfaces and so forth.

In the conventional polishing operation, a plate composed of a rigid material such as glass, metal and ceramics is used as a workpiece holder, and a workpiece is held by adhering it on the surface of the holder with an adhesive such as wax, or by vacuum adsorption using a workpiece holder surface composed of a gas-permeable porous material or a workpiece holder surface provided with multiple perforated holes.

However, if a workpiece is held directly on a workpiece holder surface composed of metal, ceramics or the like, stains may be generated on the surface of the workpiece, or scratches may be generated when the holder is harder than the workpiece. Therefore, in order to prevent such scratches and stains on the back surface of the workpiece and to obtain a workpiece having good flatness, the surface of the workpiece holder may be coated with a film of resin such as acrylic resin, polycarbonate resin and epoxy resin. Further, a method of the so-called co-rubbing polishing is performed, in which the resin coated on the surface for holding the workpiece is directly polished with a polishing pad before polishing of the workpiece so that the surface condition of the resin should match a surface condition of the polishing pad, and then the workpiece is held on the workpiece holder and polished.

An example of conventional workpiece holder for polishing is shown in FIGS. 5(a) and (b).

This workpiece holder 1 for polishing is constituted by a workpiece holder body 2 having a workpiece holding surface 15 and multiple perforated holes 4 for vacuum adsorption, and a workpiece holder back plate 5 disposed on the back side of the body. The perforated holes 4 are communicated to a vacuum apparatus not shown in the figure via a space 6 located between the workpiece holder body 2 and the workpiece holder back plate 5, and a vacuum way 7, and the workpiece is adsorbed and held on the workpiece holding surface 15 upon generation of vacuum. The workpiece holding surface 15 of the workpiece holder body 2 is coated with a resin coating film 3 that has perforated holes 4.

Upon polishing of a wafer, a workpiece is held on the workpiece holding surface 15 of the workpiece holder 1 for polishing by vacuum adsorption or the like, and the holder is mounted on the polishing head (not shown) having a rotation shaft. The holder is rotated by the polishing head and simultaneously presses the workpiece against a polishing pad adhered on a rotating polishing turn table at a predetermined load. A polishing agent is fed from a nozzle at a predetermined flow rate on the polishing pad, and then fed between the workpiece and the polishing pad, and thus the workpiece is polished.

When such polishing is performed, heat is generated during the polishing. If the polishing is performed by using such a workpiece holder having the configuration shown in FIG. 5, in particular, the heat generated during the polishing of the workpiece is gradually transferred to the workpiece, the workpiece holding surface (the portion of resin coating film) and the workpiece holder body in this order. And heat will be accumulated when the polishing is repeated.

However, since the workpiece holding surface is subjected to cleaning with a brush and so forth with supplying a cleaning solution in order to remove stains on the surface immediately before the polishing operation, the surface is cooled at this stage. On the other hand, in the workpiece holder body, in particular, as for the back side (the side of the back plate 5), heat will be gradually accumulated. For this reason, the amounts of the accumulated heat and radiated heat differ at the front surface and the back surface of the workpiece holder body. Therefore, when the number of the polishing operation (batch number of polishing operation) increases, there begins to be generated a temperature difference between the workpiece holding surface side and the back side of the workpiece holder body, and thus thermal deformation is caused in the whole workpiece holder body. Such deformation of the whole workpiece holder body causes a problem that it results in degradation of flatness of a workpiece held on it and polished.

In order to solve such a problem, a material showing low thermal expansion might be conventionally used for the workpiece holder body. However, under the current situation where a workpiece of extremely high degree of flatness is desired, only use of this means still leaves many insufficient points.

For the polishing, not only appropriate thermal expansion characteristics, but also rigidity enough to stand the polishing pressure is required. If these thermal expansion and rigidity as well as cost are taken into consideration, it is difficult under the present condition to obtain a workpiece holder for polishing that fulfills all of these requirements.

Further, if the surface of the workpiece holder is coated with a film of resin such as acrylic resin, polycarbonate resin and epoxy resin in order to prevent scratches and stains on the workpiece and to obtain a workpiece showing good flatness as described above, thermal deformation is likely to be significantly caused by the heat generation during the polishing, since the thermal characteristics of the resin (coefficient of thermal expansion and heat conductivity) are significantly differ from those of the material used for the workpiece holder body (for example, ceramics such as SiC). Thus, it is difficult to obtain high flatness.

DISCLOSURE OF THE INVENTION

Therefore, the present invention was accomplished in view of the aforementioned problems, and its main object is to provide a workpiece holder for polishing, a polishing apparatus and a polishing method, which can, in polishing utilizing a workpiece holder having such a configuration as described above, provide a workpiece having good flatness and showing a good magic mirror image by suppressing thermal deformation of the workpiece holder body and deformation of a resin film coated on the workpiece holding surface without degrading flatness of a workpiece held on the workpiece holder in the polishing of the workpiece, even when the number of polishing operation (batch number of polishing operation) increases.

In order to achieve the aforementioned object, the workpiece holder for polishing of the present invention is a workpiece holder for polishing comprising at least a workpiece holder body having multiple perforated holes for holding a workpiece by vacuum adsorption and a back plate disposed on the back side of the body, which is provided with temperature controlling means or cooling means for the holder body.

If such temperature controlling means or cooling means is used, the temperature difference between the workpiece holding surface and the back surface of the workpiece holder body and the temperature difference between a center portion and a peripheral portion of the workpiece holder body are eliminated, and thus the temperature becomes substantially uniform for the whole workpiece holder body. Therefore, thermal deformation of the workpiece holder body and the workpiece is hardly caused, and thus a workpiece showing high flatness can be obtained. Further, if such cooling means is used, the heat generation due to the polishing is eliminated. Therefore, the thermal expansion of the workpiece and the workpiece holder body is suppressed, and thus there can be produced a workpiece showing favorable flatness and good magic mirror image level. Furthermore, the same effect as described above can also be obtained when the workpiece holding surface of the workpiece holder body is coated with a resin coating film for the purpose of protection of the workpiece holding surface or co-rubbing polishing. The obtained workpiece showing high flatness, in particular when it is a semiconductor wafer, makes it possible to reduce various film thickness failures in the highly integrated device production step and improve yield of highly integrated devices.

In this case, the temperature controlling means or the cooling means may be a mechanism for flowing a temperature-controlled liquid or gas into a vacuum system way of the workpiece holder for polishing.

If such a mechanism is provided as the temperature controlling means or the cooling means, it can be easily constructed by using an existing apparatus, and both the temperature control and cooling of the workpiece holder body, the resin film and the workpiece can be performed very easily.

Further, in this case, the temperature controlling means or the cooling means may be a fluid jacket provided in the workpiece holder body.

This fluid jacket can be provided inside the workpiece holder body or around the workpiece holder body. By flowing a temperature-controlled liquid or gas into the fluid jacket, temperature control and cooling of the workpiece holder body and the workpiece can be performed very easily. Moreover, since cooling can be performed also during the polishing, the workpiece holder body and the workpiece can be maintained to be at a substantially constant temperature during the polishing. Thus, the workpiece can be finished into a workpiece showing further higher flatness.

Furthermore, in this case, the temperature controlling means or the cooling means may be a heat radiator plate provided between the workpiece holder body and the back plate constituting the workpiece holder for polishing.

If such a structure is used, the heat generated during the polishing can be discharged outside the workpiece holder for polishing via the workpiece, the resin film, the workpiece holder body and the heat radiator plate, and temperature increase of the workpiece holder body and the workpiece can be suppressed. Therefore, deformation of the holder body and thermal expansion of the workpiece can be suppressed to polish the workpiece into a workpiece showing good flatness.

Further, the material of the back plate of the workpiece holder for polishing is desirably a heat radiating material.

If a heat radiating material that shows high heat conductivity is used also for the material of the back plate of the workpiece holder for polishing as described above, the heat eliminating effect can further be enhanced as is attained by the aforementioned heat radiator plate.

The apparatus for polishing a workpiece of the present invention is a polishing apparatus comprising at least a turn table adhered with a polishing pad, means for supplying a polishing agent to a surface of the polishing pad and a workpiece holder for polishing for forcibly pressing a workpiece on the surface of the polishing pad, wherein the workpiece holder for polishing is the one described above.

By using a polishing apparatus comprising a workpiece holder for polishing in which a workpiece holder body is provided with temperature controlling means as described above, processing of workpiece showing high flatness becomes possible.

Further, the method for polishing a workpiece of the present invention is a method wherein a workpiece is polished by using the aforementioned apparatus for polishing a workpiece.

According to the polishing method performed by using a polishing apparatus comprising the workpiece holder for polishing in which a workpiece holder body is provided with temperature controlling means or cooling means as described above, a workpiece can be held with high precision, and therefore it becomes possible to perform processing of a workpiece so that it should have high flatness. Further, the polishing method of the present invention can also be applied to the so-called co-rubbing polishing, in which the workpiece holding surface is coated with a film of resin such as acrylic resin, polycarbonate resin and epoxy resin, the resin film is directly polished with a polishing pad before polishing of a workpiece so that the surface condition of the resin film should match the surface condition of the polishing pad, and then a workpiece is polished, and it can secure high flatness and good magic mirror image.

In this case, temperature of the workpiece holder body can be controlled after completion of each polishing batch by using the aforementioned temperature controlling means or cooling means.

If the temperature of the workpiece holder body is adjusted to a predetermined temperature for every batch, then the workpiece is held by vacuum adsorption, and polishing is started as described above, the heat accumulation is prevented and workpieces showing substantially no flatness fluctuation among the batches can be obtained. Thus, the yield and the productivity can be improved.

Further, in this case, when workpieces are polished in multiple batches, the polishing can be performed while controlling the temperature difference in the workpiece holder body at the start of the polishing to be within ±1° C. for each batch.

Although it depends on the range of acceptable flatness, if the polishing is performed while controlling the temperature difference in the workpiece holder body, in particular, the temperature difference of inside or back side of the workpiece holder body, at the start of the polishing for every batch to be within 5° C., preferably within ±1° C., as for the recent demand for highly flat wafers, highly precise workpieces showing substantially no flatness fluctuation among the batches can be obtained.

According to the present invention, not only good flatness can be obtained in the polishing of a workpiece by suppressing the thermal deformation of the workpiece holder body and the deformation of the resin coated on the workpiece holding surface without degrading the flatness of workpieces even when the number of polishing process increases, but also workpieces showing a good magic mirror image level can be obtained.

BEST MODE FOR CARRYING OUT THE INVENTION

Hereafter, embodiments of the present invention will be explained. However, the present invention is not limited to these.

As described above, when polishing is continued by using a conventional workpiece holder for polishing, heat is accumulated in the workpiece holder body. Thus, the workpiece holder body may gradually suffer a thermal deformation, or flatness may be degraded due to difference between a thermal deformation of a resin coated on the workpiece holding surface and the thermal deformation of the workpiece holder body.

Therefore, in order to solve these problems, the inventors of the present invention accomplished a polishing method and polishing apparatus that can maintain good flatness regardless of the increase of number of polishing operation by adding a mechanism for cooling the workpiece holder body or preventing heat accumulation in the same to a polishing apparatus in which a workpiece is held on a workpiece holder for polishing and one side of the workpiece is polished.

Figure 1:
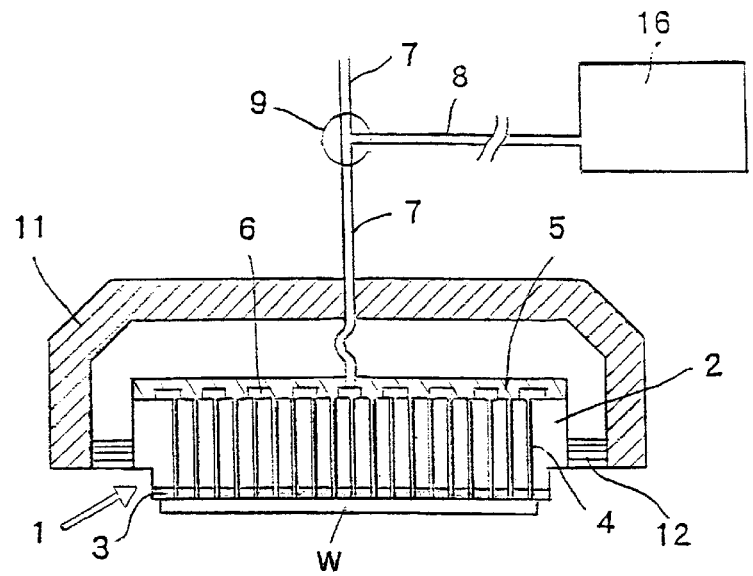
FIG. 1 is a schematic explanatory view showing an example of the workpiece holder for polishing of the present invention.
Figure 2:
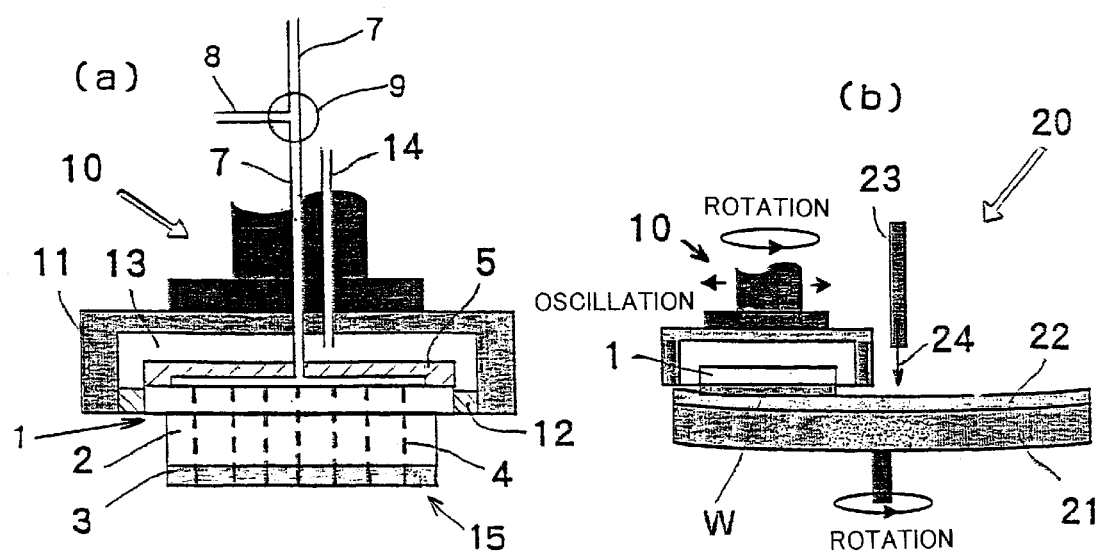
FIG. 2 includes schematic explanatory views showing a polishing head provided with the workpiece holder for polishing of the present invention and a polishing apparatus having the polishing head: (a) the polishing head, and (b) the workpiece polishing apparatus.

First, the polishing apparatus of the present invention will be explained with reference to the drawings. FIG. 1 is a schematic explanatory view for explaining a schematic configuration of the workpiece holder for polishing constituting a polishing apparatus as an example of the present invention. FIGS. 2(a) and (b) are explanatory views for explaining schematic configurations of (a) a polishing head provided with a workpiece holder for polishing and (b) a polishing apparatus having the polishing head.

The polishing apparatus of the present invention is constituted as an apparatus for polishing one surface of a workpiece, for example, a semiconductor wafer, and as shown in FIG. 2(b), the polishing apparatus 20 comprises a rotating polishing turn table (turning table) 21, a workpiece holder 1 for polishing mounted on a polishing head 10, and a polishing agent feeding nozzle 23. A polishing pad 22 is adhered on the upper surface of the polishing turn table 21. The polishing turn table 21 is rotated at a predetermined rotation speed by a rotating shaft.

The workpiece holder 1 for polishing holds a workpiece (wafer) W on its workpiece holding surface 15 by vacuum adsorption or the like, and mounted on the polishing head 10 having the rotation shaft. The holder is rotated by the polishing head 10 and simultaneously presses the workpiece W against the polishing pad 22 at a predetermined load. A polishing agent 24 is fed between the workpiece W and the polishing pad 22, and thus the workpiece W is polished.

Further, as shown in FIG. 1 and FIG. 2(a), the workpiece holder 1 for polishing used for the polishing apparatus of the present invention is constituted by a workpiece holder body 2 having multiple perforated holes 4 for vacuum adsorption on a workpiece holding surface 15, and a workpiece holder back plate 5 provided on the back side of the body. The perforated holes 4 are communicated to a vacuum generating apparatus not shown in the figure via a space 6 located between the workpiece holder body 2 and the workpiece holder back plate 5, and a vacuum way 7, and the workpiece w is adsorbed and held on the workpiece holding surface 15 upon generation of vacuum. The workpiece holding surface 15 of the workpiece holder body 2 is coated with a resin coating material 3.

According to the present invention, means for controlling temperature of the workpiece holder body 2, in particular, means for cooling the workpiece holder body 2, is provided so that there should not be caused a heat distribution between the surface side and the back side of the workpiece holder body 2, for example, after completion of the polishing.

As an example of this temperature controlling means, means for cooling the workpiece holder body 2 or means for temperature control of the same is provided in the way of the vacuum system. That is, a selector valve 9 is provided in the middle of the vacuum way 7 and connected to a temperature-controlled fluid tank 16 via a temperature-controlled fluid way 8, so that temperature-controlled fluid (gas or liquid) can be supplied into the way of the vacuum system.

Figure 3:
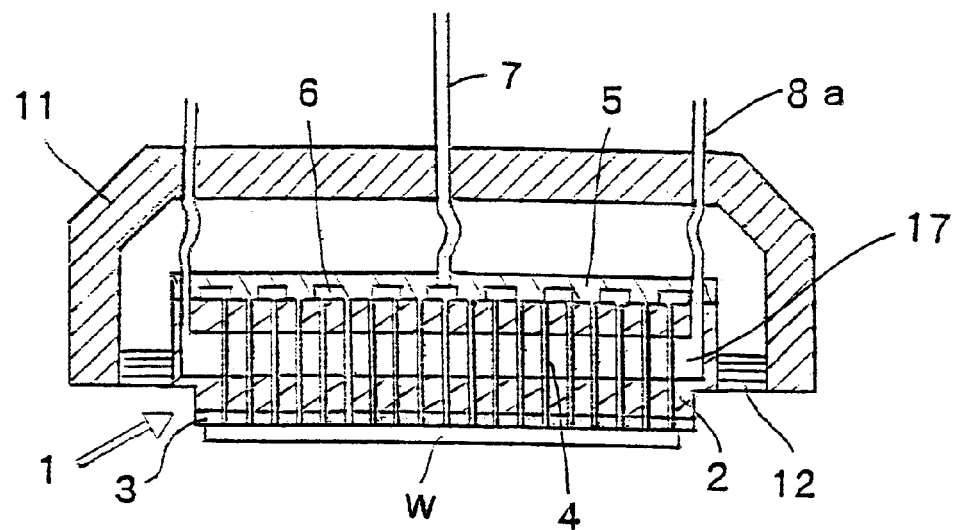
FIG. 3 is an explanatory view showing another example of the workpiece holder for polishing of the present invention (provided with a fluid jacket).

As another structure, as shown in FIG. 3, a fluid jacket 17 for temperature control or cooling is provided inside the workpiece holder body 2 and a temperature-controlled fluid is fed from a temperature-controlled fluid tank (not shown) into it via a temperature-controlled fluid way 8a, so as to cool the heat accumulated in the workpiece holder body 2 and thereby reduce thermal deformation. This fluid jacket may also be provided around the workpiece holder body 2. In such a case, there is also obtained an advantage that a temperature-controlled fluid can be flown also during the polishing.

Figure 4:
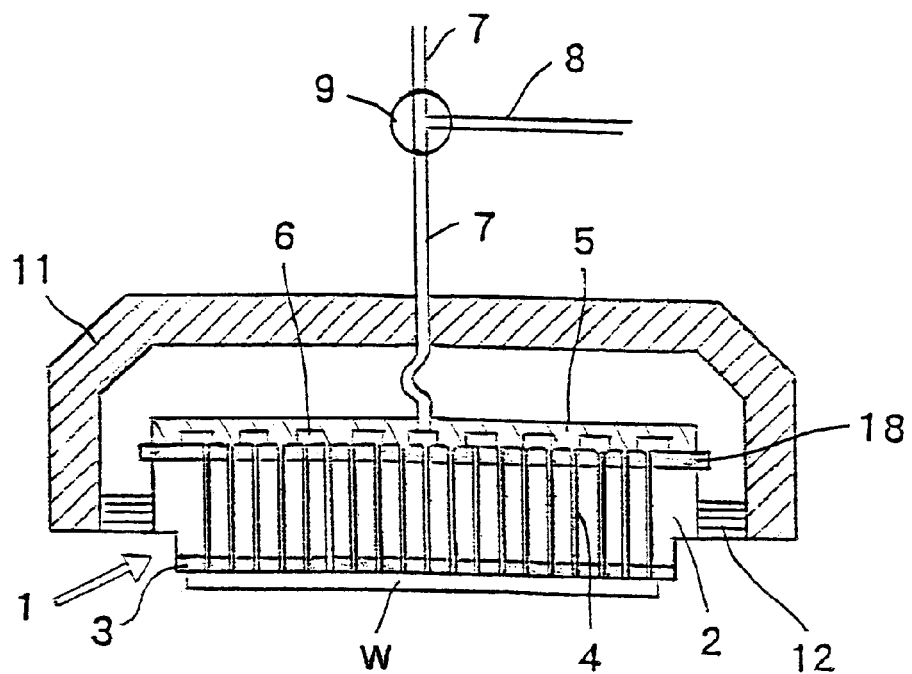
FIG. 4 is an explanatory view showing a further example of the workpiece holder for polishing (provided with a heat radiator plate).

Further, as a still further structure, as shown in FIG. 4, there is provided a heat radiator plate 18 for radiating heat into a space between the workpiece holder body 2 and the workpiece holder back plate 5 provided on the back side of the body. Alternatively, a heat-radiating material showing high heat conductivity is used as the material of the workpiece holder back plate 5 to improve heat radiation. In these ways, the heat accumulated in the workpiece holder body 2 can be cooled and thus the thermal deformation can be reduced. In this example, there is exemplified a case where a mechanism for flowing a fluid in the vacuum system way is provided together with a heat radiator plate. The material of the heat radiator plate 18 is preferably one showing good heat conductivity, and it is preferably one showing high heat conductivity, such as SiC, high-pressure phase cubic boron nitride (c-BN) and low-pressure phase hexagonal boron nitride (h-BN). Further, the heat radiator plate 18 is preferably in the form of a simple sheet or a plate having heat radiating fins at peripheral portions.

As for the material of the back plate 5, urethane resins and so forth have conventionally been used. However, a metal showing better heat conductivity compared with urethane resins or a material showing better heat conductivity compared with the material of the workpiece holder body 2 is preferred. When SiC is used for the workpiece holder body, it is preferable to use SiC also for the back plate, or use one showing high heat conductivity, such as high-pressure phase cubic boron nitride (c-BN) and low-pressure phase hexagonal boron nitride (h-BN). Heat radiating fins may also be provided on the back plate on the side opposite to the side in contact with the holder body. In this case, further efficient heat radiation can be attained.

The polishing head 10 has a pressurized space 13 in its rotating holder 11, and holds the workpiece holder 1 airtightly via an elastomer ring 12. The pressurized space 13 communicates with an air compressor (now shown) via a pressurization way 14. The workpiece W held on the surface of coating resin 3 of the workpiece holding surface 15 by vacuum adsorption is revolved or oscillated by the workpiece holder 1, and at the same time, the back surface of the workpiece holder 1 is pressurized with air so as to press the workpiece holder 1 holding the workpiece W against the polishing pad 22.

If the polishing is carried out by using the polishing apparatus of the present invention constituted as described above, the temperature difference in the workpiece holder body does not become large and it can be controlled so that the deformation of the workpiece holder body should become small even when the polishing is repeated. Thus, a good magic mirror image of workpiece can be obtained after the polishing and a workpiece with high flatness can be obtained.

As described above, the polishing apparatus of the present invention is the polishing apparatus in which it is provided with a temperature control mechanism, in particular, a cooling mechanism, for the workpiece holder body to remove the heat accumulated in the workpiece holder body.

In the polishing method, polishing is carried out by using the workpiece holder for polishing provided with the aforementioned temperature control mechanism.

In such an apparatus that is provided with means for cooling the workpiece holder body or means for temperature control of the same in the way of a vacuum system, in particular, suitable temperature control can be attained by flowing a temperature-controlled liquid or gas into the vacuum system way after completion of every polishing (batch) for temperature control or cooling of the workpiece holder body.

Further, when multiple batches are continuously polished, the polishing is preferably performed after the temperature difference in the workpiece holder body at the start of the polishing of each batch is controlled to be within ±1° C. It is particularly preferable to always start the polishing after controlling a constant temperature.

Furthermore, the polishing is preferably performed while controlling the temperature difference between the workpiece holder body at the start of the polishing and at the end of the polishing to be within 5° C. It is of course more preferred that there is no temperature difference, i.e., the temperature at the start of the polishing is the same as at the end of the polishing.

Hereafter, the present invention will be specifically explained with reference to examples of the present invention. However, the present is not limited to these.

EXAMPLE 1

Continuous polishing was performed by using an apparatus provided with means for cooling the workpiece holder body 2 or for temperature control of the same in the vacuum way 7 as shown in FIG. 1, i.e., an apparatus constituted so as to supply a temperature-controlled fluid into the vacuum way.

The material of the workpiece holder body 2 was composed of SiC (silicon carbide) ceramics, the coating resin 3 was composed of an epoxy resin and the workpiece holder back plate was composed of a urethane resin.

As a workpiece, used was an etched wafer W of P-type sliced from a single crystal ingot grown by the CZ method, subjected to chamfering, lapping and etching and having a thickness of 735 $\mu$m, orientation of <100> and a diameter of 200 mm.

This wafer W was adsorbed on a workpiece holding surface 15 of the workpiece holder body 2 shown in FIGS. 2(a) and (b) by vacuum adsorption and polished. Co-rubbing polishing was first performed so that the surface condition of the workpiece holding surface 15 of the coating resin 3 should match with the condition of a polishing pad 22, and then the workpiece is held on the workpiece holding surface 15 by vacuum adsorption and polished.

As for the polishing conditions, the polishing was performed with a polishing pad 22 of nonwoven fabric type (Asker C hardness of 80), polishing agent 24 of colloidal silica (pH 10.5), polishing load of 300 g/cm$^2$ and stock removal for polishing of 10 $\mu$m.

After completion of the polishing, the vacuum adsorption was released, the selector valve 9 was switched to connect a temperature-controlled fluid way 8 to a vacuum way 7, and a temperature-controlled fluid (pure water temperature-controlled to be at 23° C. was used in this example) was flown so that the temperature of the holder body should be substantially the same as the temperature at the start of the first polishing.

Since the temperature-controlled fluid was effused from perforated holes 4 and so forth in this method, the workpiece holder body 2 is preferably cooled as a whole from the back plate side to the surface side.

When the workpiece holder body 2 was sufficiently cooled and reached the temperature at the start of the polishing, a following wafer W was polished to perform the polishing for continuous 20 batches.

COMPARATIVE EXAMPLE 1

Figure 5:
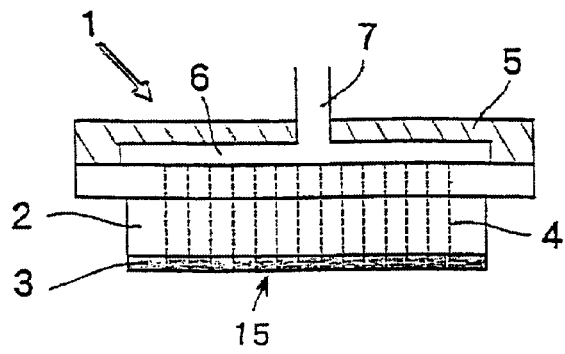
FIG. 5 includes schematic explanatory views showing an exemplary conventional workpiece holder for polishing: (a) longitudinal sectional view, and (b) front view of a workpiece holding surface.
Figure 5:
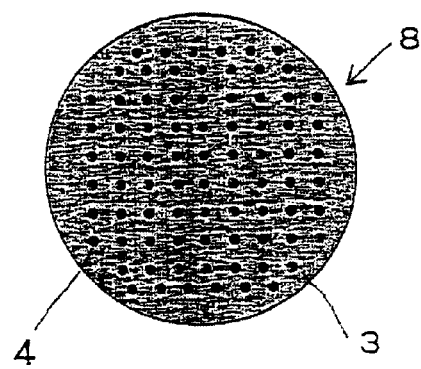

Continuous polishing was performed by using the conventional workpiece holder for polishing shown in FIG. 5.

The polished sample and the polishing conditions were similar to those of Example 1.

As a result of the polishing tests described above, it was found that, flatness of workpieces was stable regardless of the number of processing (number of processing batches) in Example 1. However, in Comparative Example 1, while a flat wafer could be obtained as in Example 1 in an early processing, the flatness was degraded with increase of the processing number. In particular, with increase of the processing number, the workpieces showed a tendency to gradually have a convex shape.

When the temperature difference between the surface and back surface of the workpiece holder body was measured after completion of the polishing of the first batch and the 20th batch in Example 1, the temperature difference between the surface and back surface of the workpiece holder body was stable, i.e., 3° C. to 4° C., irrespective of the batch number.

In Comparative Example 1, while the temperature difference between the surface and back surface of the workpiece holder body was small after the first batch as in Example 1, the temperature difference between the surface and back surface of the workpiece holder body became large after the 20th batch. In particular, the temperature of the back surface of the workpiece holder body became higher by about 16° C. than the temperature of the back surface of the workpiece holder body after the first batch. When the temperature difference between the surface and back surface of the workpiece holder body became large as described above, thermal deformation was caused in the workpiece holder body and the matching of the conditions of the polishing pad and the workpiece holder surface was degraded. As a result, the flatness of workpieces was degraded.

The temperature of the workpiece holder body to be set, the amount of the fluid to be supplied and so forth must be arbitrarily changed depending on the workpiece and polishing conditions.

In particular, it is preferable to find suitable polishing conditions providing good matching of the surface conditions of the polishing pad and the workpiece holding surface and to perform continuous processing so that the temperature of the workpiece holder body should be always kept at a temperature meeting to the conditions. This became possible by using the apparatus and method of the present invention.

Figure 6:
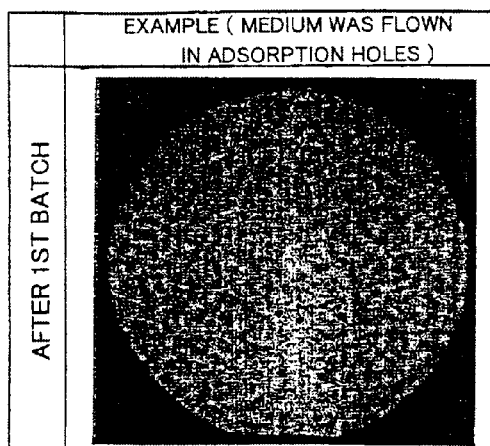
FIG. 6 includes explanatory views for comparison of variations of magic mirror images caused by a number of polishing process for workpieces obtained by the polishing method of the present invention and a conventional polishing method: (a) those obtained by the polishing method of the present invention, and (b) those obtained by a conventional polishing method.
Figure 6:
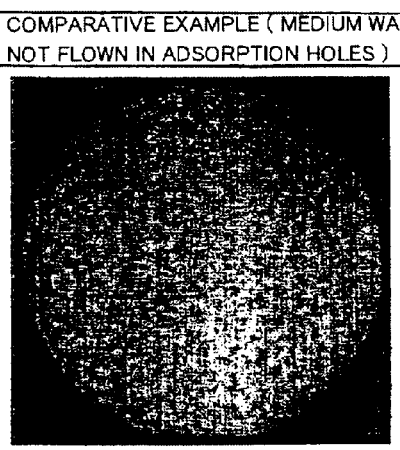

Then, the magic mirror images of the workpieces obtained in Example 1 and Comparative Example 1 were examined. As shown in FIG. 6, degradation of extremely small unevenness at a level that could be observed in a magic mirror image was observed in Comparative Example 1 (FIG. 6(b)) When the workpieces after the polishing were observed as magic mirror images in Comparative Example 1, the workpiece of the first batch provided a relatively good magic mirror image, but with increase of the number of processing batches, tinging white spots came to be observed in a grid pattern after the 6th or 7th batch. The positions of these white spots corresponded to the positions of the adsorption holes perforated in the workpiece holding surface (perforated holes for vacuum adsorption) and it indicated that the workpiece partially had a concave shape. This phenomenon indicated that the thermal deformation of the workpiece holder also influenced on the resin coated on the surface of the workpiece holder so that scratches should not be generated on the workpiece.

On the other hand, in Example 1, the degradation tendency of the magic mirror images of the workpieces for positions near the adsorption holes was not observed (FIG. 6(a)) even if the number of processing batches increased. It is considered that, since the temperature-controlled fluid was flown also in the adsorption holes (perforated holes for vacuum adsorption) in Example 1, in particular, the temperature difference at positions near the adsorption holes was also eliminated and the degradation tendency of the magic mirror images of the workpieces was not observed even if the number of processing batches increased. Thus, it was found that the method of the present invention is particularly effective for the polishing method that utilized a resin coating film on the surface of the workpiece holder.

EXAMPLE 2

Polishing was performed for 10 batches with the same conditions as those of Example 1 except that a polishing apparatus provided with a jacket for temperature control (for cooling) inside the workpiece holder body was used and pure water at 25° C. was flown in the jacket as a refrigerant to prevent heat accumulation also during the polishing. By this configuration, the temperature of the holder could be maintained at a constant temperature of 26° C., which was the temperature at the start of the first polishing, and the workpieces could be processed into those showing good flatness and good magic mirror images as in Example 1.

Flatness obtained after the first batch to the 10th batch was about 0.16 μm in terms of $SFQR_{max}$ (Site front least-squares range) for a cell size of 25 mm×25 mm. In Comparative Example 1, it was about 0.16 μm after the first batch to the 6th batch, but flatness was degraded when the temperature difference exceeded a certain level. That is, it was degraded to about 0.25 μm after the 10th batch, and hence it was found that stable wafer quality could be obtained by the present invention without the influence of the number of polishing operation.

What is claimed is:

1. A workpiece holder for polishing comprising at least a workpiece holder body having multiple perforated holes for holding a workpiece by vacuum adsorption and a back plate disposed on the back side of the body, which is provided with temperature controlling means or cooling means for the holder body, and the temperature controlling means or the cooling means is a heat radiator plate provided between the workpiece holder body and the back plate constituting the workpicce holder for polishing.

2. The workpiece holder for polishing according to claim 1, wherein the temperature controlling means or the cooling means is a mechanism for flowing a temperature-controlled liquid or gas into a vacuum system way of the workpiece holder for polishing.

3. The workpiece holder for polishing according to claim 1, wherein the temperature controlling means or the cooling means is a fluid jacket provided in the workpiece holder body.

4. The workpiece holder for polishing according to claim 1, wherein the material of the back plate of the workpiece holder for polishing is a heat radiating material.

5. An apparatus for polishing a workpiece comprising at least a turn table adhered with a polishing pad, means for supplying a polishing agent to a surface of the polishing pad and a workpiece holder for polishing for forcibly pressing a workpiece on the surface of the polishing pad, wherein the workpiece holder for polishing is a workpiece holder for polishing according to claim 1.

6. An apparatus for polishing a workpiece comprising at least a turn table adhered with a polishing pad, means for supplying a polishing agent to a surface of the polishing pad and a workpiece holder for polishing for forcibly pressing a workpiece on the surface of the polishing pad, wherein the workpiece holder for polishing is a workpiece holder for polishing according to claim 2.

7. An apparatus for polishing a workpiece comprising at least a turn table adhered with a polishing pad, means for supplying a polishing agent to a surface of the polishing pad and a workpiece holder for polishing for forcibly pressing a workpiece on the surface of the polishing pad, wherein the workpiece holder for polishing is a workpiece holder for polishing according to claim 3.

8. An apparatus for polishing a workpiece comprising at least a turn table adhered with a polishing pad, means for supplying a polishing agent to a surface of the polishing pad and a workpiece holder for polishing for forcibly pressing a workpiece on the surface of the polishing pad, wherein the workpiece holder for polishing is a workpiece holder for polishing according to claim 4.

9. A method for polishing a workpiece, wherein the workpiece is polished by using the apparatus for polishing a workpiece according to claim 5.

10. A method for polishing a workpiece, wherein the workpiece is polished by using the apparatus for polishing a workpiece according to claim 6.

11. A method for polishing a workpiece, wherein the workpiece is polished by using the apparatus for polishing a workpiece according to claim 7.

12. A method for polishing a workpiece, wherein the workpiece is polished by using the apparatus for polishing a workpiece according to claim 8.

13. The method for polishing a workpiece according to claim 9, wherein temperature of the workpiece holder body is controlled after completion of each polishing batch by using the temperature controlling means or cooling means.

14. The method for polishing a workpiece according to claim 10, wherein temperature of the workpiece holder body is controlled after completion of each polishing batch by using the temperature controlling means or cooling means.

15. The method for polishing a workpiece according to claim 11, wherein temperature of the workpiece holder body is controlled after completion of each polishing batch by using the temperature controlling means or cooling means.

16. The method for polishing a workpiece according to claim 12, wherein temperature of the workpiece holder body is controlled after completion of each polishing batch by using the temperature controlling means or cooling means.

17. The method for polishing a workpiece according to claim 9, wherein, when workpieces are polished in multiple batches, the polishing is performed while controlling the temperature difference in the workpiece holder body at the start of the polishing to be within ±1° C. for each batch.

18. The method for polishing a workpiece according to claim 10, wherein, when workpieces are polished in multiple batches, the polishing is performed while controlling the temperature difference in the workpiece holder body at the start of the polishing to be within ±1° C. for each batch.

19. The method for polishing a workpiece according to claim 11, wherein, when workpieces are polished in multiple batches, the polishing is performed while controlling the temperature difference in the workpiece holder body at the start of the polishing to be within ±1° C. for each batch.

20. The method for polishing a workpiece according to claim 12, wherein, when workpieces are polished in multiple batches, the polishing is performed while controlling the temperature difference in the workpiece holder body at the start of the polishing to be within ±1° C. for each batch.

* * * * *

UNITED STATES PATENT AND TRADEMARK OFFICE
CERTIFICATE OF CORRECTION

| | |
|---|---|
| PATENT NO. | : 6,769,966 B2 |
| DATED | : August 3, 2004 |
| INVENTOR(S) | : Kouichi Okamura et al. |

It is certified that error appears in the above-identified patent and that said Letters Patent is hereby corrected as shown below:

<u>Title page,</u>
Item [22], PCT Filing date, please change "PCT Filed: May 27, 2001" to -- PCT filed: March 27, 2001 --.

Signed and Sealed this

Third Day of May, 2005

JON W. DUDAS
*Director of the United States Patent and Trademark Office*